(12) United States Patent
Kato et al.

(10) Patent No.: US 11,195,749 B2
(45) Date of Patent: Dec. 7, 2021

(54) SEMICONDUCTOR DEVICE AND MANUFACTURING METHOD

(71) Applicant: FUJI ELECTRIC CO., LTD., Kanagawa (JP)

(72) Inventors: Yoshiharu Kato, Matsumoto (JP); Tohru Shirakawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/429,087

(22) Filed: Jun. 3, 2019

(65) Prior Publication Data

US 2020/0020579 A1    Jan. 16, 2020

(30) Foreign Application Priority Data

Jul. 13, 2018    (JP) .............................. JP2018-133496

(51) Int. Cl.
| *H01L 29/08*  | (2006.01) |
| *H01L 29/161* | (2006.01) |
| *H01L 21/336* | (2006.01) |
| *H01L 21/4763* | (2006.01) |
| *H01L 21/44*  | (2006.01) |
| *H01L 21/768* | (2006.01) |
| *H01L 23/532* | (2006.01) |

(Continued)

(52) U.S. Cl.
CPC .. *H01L 21/76846* (2013.01); *H01L 21/02186* (2013.01); *H01L 21/28518* (2013.01); *H01L 21/76864* (2013.01); *H01L 23/53266* (2013.01); *H01L 27/0716* (2013.01); *H01L 29/7397* (2013.01); *H01L 29/8611* (2013.01)

(58) Field of Classification Search
CPC ............. H01L 21/28518; H01L 29/401; H01L 23/53252; H01L 29/456; H01L 21/76843; H01L 21/76856; H01L 21/76855; H01L 23/485

See application file for complete search history.

(56) References Cited

U.S. PATENT DOCUMENTS 6,177,338 B1 *  1/2001  Liaw ................. H01L 21/76868
                                                438/629
6,265,305 B1 *  7/2001  Tsou ................. H01L 21/76838
                                                257/E21.255

(Continued)

FOREIGN PATENT DOCUMENTS

JP      H0697111 A       4/1994
JP      2000195819 A     7/2000

(Continued)

*Primary Examiner* — Brian Turner (57) ABSTRACT

To provide a semiconductor device that has barrier metal and has a small variation in a threshold voltage. A semiconductor device is provided, including a semiconductor substrate, an interlayer dielectric film arranged on an upper surface of the semiconductor substrate, a titanium layer provided on the interlayer dielectric film, and a titanium nitride layer provided on the titanium layer, where the interlayer dielectric film is provided with an opening that exposes a part of the upper surface of the semiconductor substrate, the titanium layer and the titanium nitride layer are also provided within the opening, and the titanium layer arranged in contact with the semiconductor substrate and on a bottom portion of the opening is entirely titanium-silicided.

7 Claims, 9 Drawing Sheets

(51) Int. Cl.
 *H01L 21/02* (2006.01)
 *H01L 27/07* (2006.01)
 *H01L 21/285* (2006.01)
 *H01L 29/861* (2006.01)
 *H01L 29/739* (2006.01)

(56) References Cited

U.S. PATENT DOCUMENTS

| | | | | |
|---|---|---|---|---|
| 6,407,002 | B1 * | 6/2002 | Lin | H01L 21/31144 257/E21.256 |
| 2002/0050648 | A1 | 5/2002 | Kishida | |
| 2005/0287799 | A1 * | 12/2005 | Lee | H01L 21/28512 438/648 |
| 2009/0166861 | A1 * | 7/2009 | Lehr | H01L 24/85 257/737 |
| 2009/0280641 | A1 * | 11/2009 | Kang | H01L 21/76814 438/653 |
| 2010/0237503 | A1 * | 9/2010 | Chapple-Sokol | H01L 21/76846 257/758 |
| 2013/0187159 | A1 * | 7/2013 | Helm | H01L 23/535 257/52 |
| 2015/0147880 | A1 * | 5/2015 | Lee | H01L 23/53209 438/660 |
| 2015/0235956 | A1 * | 8/2015 | Lin | H01L 21/76831 257/757 |
| 2016/0043035 | A1 * | 2/2016 | Lin | H01L 21/76855 257/751 |
| 2016/0351446 | A1 | 12/2016 | Yamaguchi | |
| 2017/0148889 | A1 * | 5/2017 | Chen | H01L 29/66484 |

FOREIGN PATENT DOCUMENTS

| | | |
|---|---|---|
| JP | 2002203858 A | 7/2002 |
| JP | 5672719 B2 | 2/2015 |
| JP | 2016225512 A | 12/2016 |

\* cited by examiner

SEMICONDUCTOR DEVICE AND MANUFACTURING METHOD

The contents of the following Japanese patent application(s) are incorporated herein by reference:
NO. 2018-133496 filed in JP on Jul. 13, 2018.

BACKGROUND

1. Technical Field

The present invention relates to a semiconductor device and a manufacturing method.

2. Related Art

Conventionally, it has been known that a semiconductor device provided with a transistor such as an Insulated Gate Bipolar Transistor (IGBT) has a structure including barrier metal in which a titanium layer, a titanium nitride layer and the like are stacked (for example, refer to Patent Documents 1-4).
[Patent Document 1] Japanese Patent Application Publication No. 2016-225512
[Patent Document 2] Japanese Patent Application Publication No. 2000-195819
[Patent Document 3] Japanese Patent No. 5672719
[Patent Document 4] Japanese Patent Application Publication No. H6-97111

Defect generated in a semiconductor substrate can be recovered by implanting hydrogen ions within the semiconductor substrate. However, because a titanium layer obstructs hydrogen passing therethrough, in a case where the barrier metal is provided, the defect in the semiconductor substrate may not be able to be sufficiently recovered.

SUMMARY

To solve the above-described issue, in a first aspect of the present invention, a semiconductor device including a semiconductor substrate is provided. The semiconductor device may include an interlayer dielectric film arranged on an upper surface of the semiconductor substrate. The semiconductor device may include a titanium layer provided on of the interlayer dielectric film. The semiconductor device may include a titanium nitride layer provided on the titanium layer. The interlayer dielectric film may be provided with an opening that exposes a part of the upper surface of the semiconductor substrate. The titanium layer and the titanium nitride layer may also be provided within the opening. The titanium layer arranged in contact with the semiconductor substrate and on the bottom portion of the opening may be entirely titanium-silicided.

The semiconductor device may include a tungsten plug provided in the opening and on the titanium nitride layer.

The titanium layer provided on the interlayer dielectric film in a region other than the opening may be a titanium layer that does not include a titanium-silicided portion.

The thickness of the titanium layer provided on the interlayer dielectric film in a region other than the opening may be of 30 nm or larger and 45 nm or smaller.

At least a part of a side wall of the interlayer dielectric film in the opening may have an upwardly convex curved shape.

The semiconductor substrate may have a plurality of trench portions that are provided from the upper surface of the semiconductor substrate to inside the semiconductor substrate and that are arranged in the upper surface of the semiconductor substrate in a predetermined array direction. The semiconductor substrate may have a mesa portion sandwiched by two trench portions in the array direction. The interlayer dielectric film may be provided covering an upper end portion of at least some of the trench portions. The opening may be provided so as to expose an upper surface of at least some of the mesa portions. The side wall of the interlayer dielectric film may have a curved shape above at least both end portions of the mesa portion in the array direction.

The semiconductor device may include a second titanium layer that is provided on the titanium nitride layer and on the tungsten plug, and is not titanium-silicided.

In a second aspect of the present invention, a method of manufacturing a semiconductor device is provided. The manufacturing method may include a dielectric film forming step of forming an interlayer dielectric film on an upper surface of a semiconductor substrate. The manufacturing method may include an opening forming step of forming an opening in the interlayer dielectric film, the opening exposing a part of the upper surface of the semiconductor substrate. The manufacturing method may include a titanium layer forming step of forming a titanium layer on the interlayer dielectric film and in the opening. The manufacturing method may include a titanium nitride layer forming step of forming a titanium nitride layer on the titanium layer. The manufacturing method may include a titanium siliciding step of entirely titanium siliciding the titanium layer arranged in contact with the semiconductor substrate and on a bottom portion of the opening.

In the titanium siliciding step, the semiconductor substrate may be annealed at 700° C. or higher.

In the titanium layer forming step, a titanium layer of 30 nm or larger and 45 nm or smaller may be formed.

The manufacturing method may include a tungsten plug forming step of forming a tungsten plug in the opening and on the titanium nitride layer. An annealing temperature for the semiconductor substrate in the titanium siliciding step may be higher than a temperature at which the tungsten film is formed in the tungsten plug forming step.

The manufacturing method may include a hydrogen annealing step of annealing the semiconductor substrate in hydrogen-containing atmosphere before the titanium layer forming step. The annealing temperature for the semiconductor substrate in the titanium siliciding step may be higher than the annealing temperature in the hydrogen annealing step.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side of a direction parallel to a depth direction of the semiconductor substrate is referred to as an "upper" side and the other side thereof is referred to as a "lower" side. One surface of two main surfaces of a substrate, a layer or another member is referred to as an upper surface and the other surface thereof is referred to as a lower surface. The "upper" and "lower" directions are not limited to the direction of gravity or a direction of an attachment to a substrate and the like at the time of implementation of a semiconductor device.

In the present specification, technical matters may be described using the orthogonal coordinate axes of X-axis, Y-axis and Z axis. In the present specification, a plane parallel to the upper surface of the semiconductor substrate is defined as an X-Y plane and a depth direction perpendicular to the upper surface of the semiconductor substrate is defined as the Z axis.

In each embodiment, although an example in which a conductivity type of each region in the semiconductor substrate is N type or P type is shown, the conductivity type of each region may also be the opposite conductivity type. Also, in the present specification, if P+ type (or N+ type) is stated, it means a doping concentration is higher than that of P type (or N type), and if P− type (or N− type) is stated, it means the doping concentration is lower than that of the P type (or N type).

In the present specification, the doping concentration indicates a concentration of donor or acceptor impurities. In the present specification, the doping concentration may indicate a concentration difference between the donors and the acceptors. Also, the doping concentration in a doping region may indicate a peak value of a doping concentration distribution in the doping region.

Figure 1:
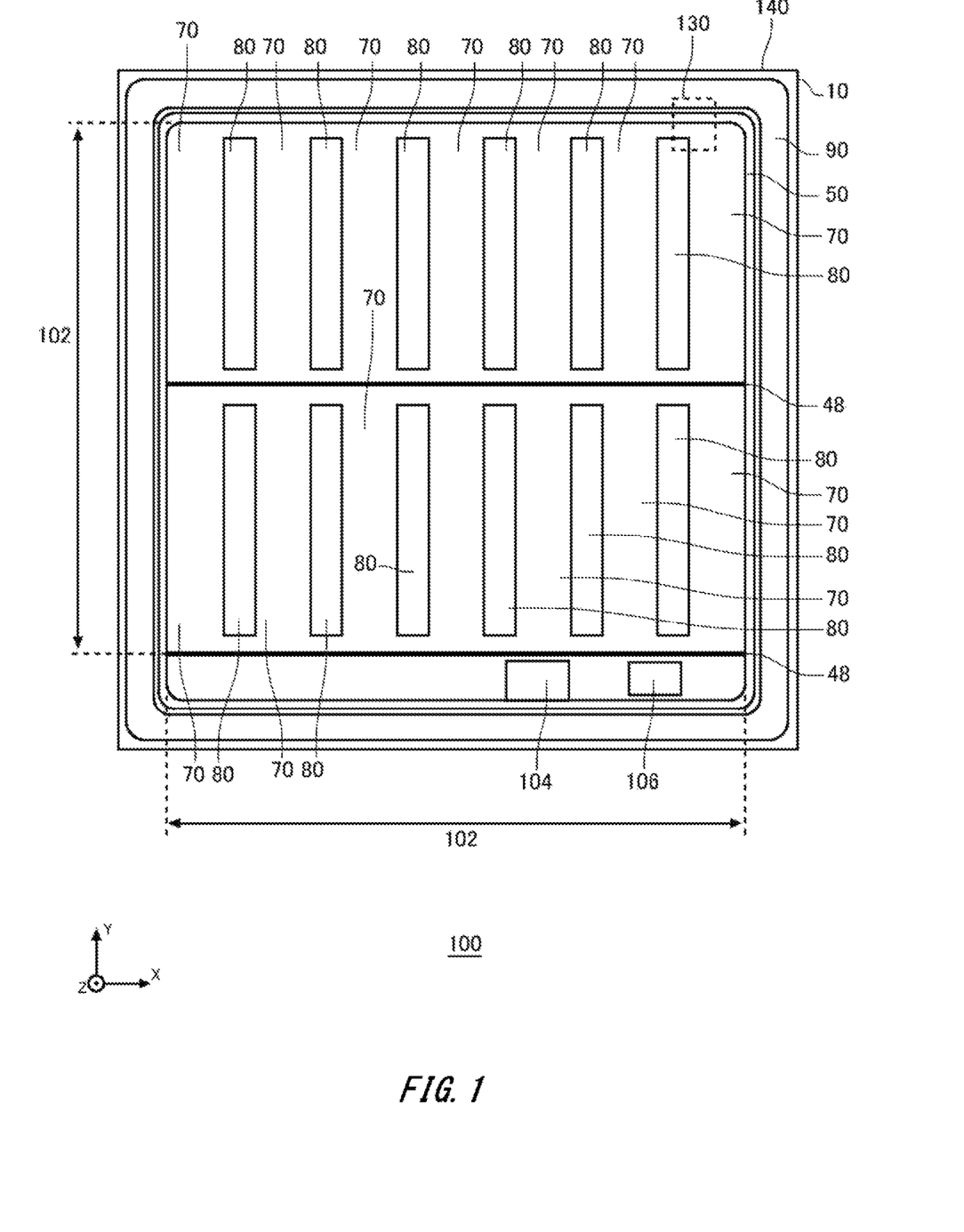
FIG. 1 shows a structure of an upper surface of a semiconductor device 100 according to one embodiment of the present invention.

FIG. 1 shows a structure of an upper surface of a semiconductor device 100 according to one embodiment of the present invention. The semiconductor device 100 includes a semiconductor substrate 10. Although the semiconductor substrate 10 of the present example is a silicon substrate, the semiconductor substrate 10 may also be a substrate of another material as long as a damage of the substrate can be recovered by hydrogen ions. Within the semiconductor substrate 10, a damage such as crystal defect caused by an implantation of donor ions or acceptor ions is present.

In the present specification, an edge portion in an outer periphery of the semiconductor substrate 10 in a top view is defined as an outer peripheral edge 140. The top view indicates a view as seen parallel to the Z axis from an upper surface side of the semiconductor substrate 10. The semiconductor device 100 of the present example includes an active region 102 and an edge termination structure portion 90. The active region 102 is a region in which main current flows between the upper surface and a lower surface of the semiconductor substrate 10 in a case where the semiconductor device 100 is controlled to be in an ON state. That is, the region from the upper surface to the lower surface or from the lower surface to the upper surface of the semiconductor substrate 10 is a region in which current flows inside the semiconductor substrate 10 in the depth direction.

The active region 102 is provided with a transistor portion 70. As shown in FIG. 1, the active region 102 may also be further provided with a diode portion 80. The transistor portion 70 includes a transistor such as an IGBT. The diode portion 80 includes a diode such as a Free Wheeling Diode (FWD). The transistor portion 70 and the diode portion 80 are alternately arranged in a predetermined array direction on the upper surface of the semiconductor substrate 10. The array direction is an X-axis direction in FIG. 1.

Each diode portion 80 is provided with an N+ type cathode region in a region being in contact with the lower surface of the semiconductor substrate 10. The diode portion 80 shown by solid lines in FIG. 1 is a region in which a cathode region is provided on the lower surface of the semiconductor substrate 10. In the semiconductor device 100 of the present example, among regions being in contact with the lower surface of the semiconductor substrate, a region other than the cathode region is a P+ type collector region.

The edge termination structure portion 90 is provided between the active region 102 and the outer peripheral edge 140 of the semiconductor substrate 10 on the upper surface of the semiconductor substrate 10. The edge termination structure portion 90 may be annularly arranged so as to surround the active region 102 on the upper surface of the semiconductor substrate 10. The edge termination structure portion 90 of the present example is arranged along the outer peripheral edge 140 of the semiconductor substrate 10. The edge termination structure portion 90 relaxes concentration of electric field on the upper surface side of the semiconductor substrate 10. The edge termination structure portion 90 has, for example, a guard ring, a field plate, a Resurf and a structure of a combination thereof.

On the upper surface of the semiconductor substrate 10, a gate metal layer 50 is provided between the edge termination structure portion 90 and the active region 102. Although an interlayer dielectric film is provided between the gate metal layer 50 and the semiconductor substrate 10, the interlayer dielectric film is omitted in FIG. 1.

The gate metal layer 50 may be provided so as to surround the active region 102 in the top view of the semiconductor substrate 10. The gate metal layer 50 is electrically connected to the gate pad 104 that is provided outside the active region 102. The gate pad 104 may be arranged between the gate metal layer 50 and the active region 102. Between the gate metal layer 50 and the active region 102, one or more pads, such as an emitter pad 106 and the like electrically connected to an emitter electrode, may be provided.

The gate metal layer 50 may be formed of aluminum or aluminum-silicon alloy. The gate metal layer 50 is electrically connected to the transistor portion 70 and supplies a gate voltage to the transistor portion 70.

The semiconductor device 100 may include a gate runner 48. The gate runner 48 is electrically connected to the gate metal layer 50 and extends above the active region 102. At least one gate runner 48 may be provided across the active region 102 in the X-axis direction. The gate runner 48 supplies the gate voltage to the transistor portion 70. The gate runner 48 may be formed of a semiconductor material such as polysilicon doped with impurities, and may also be formed of metal. The gate runner 48 is provided above the semiconductor substrate 10 or inside the semiconductor substrate 10, and the semiconductor substrate 10 and the gate runner 48 are insulated from each other by an insulating film.

Figure 2:
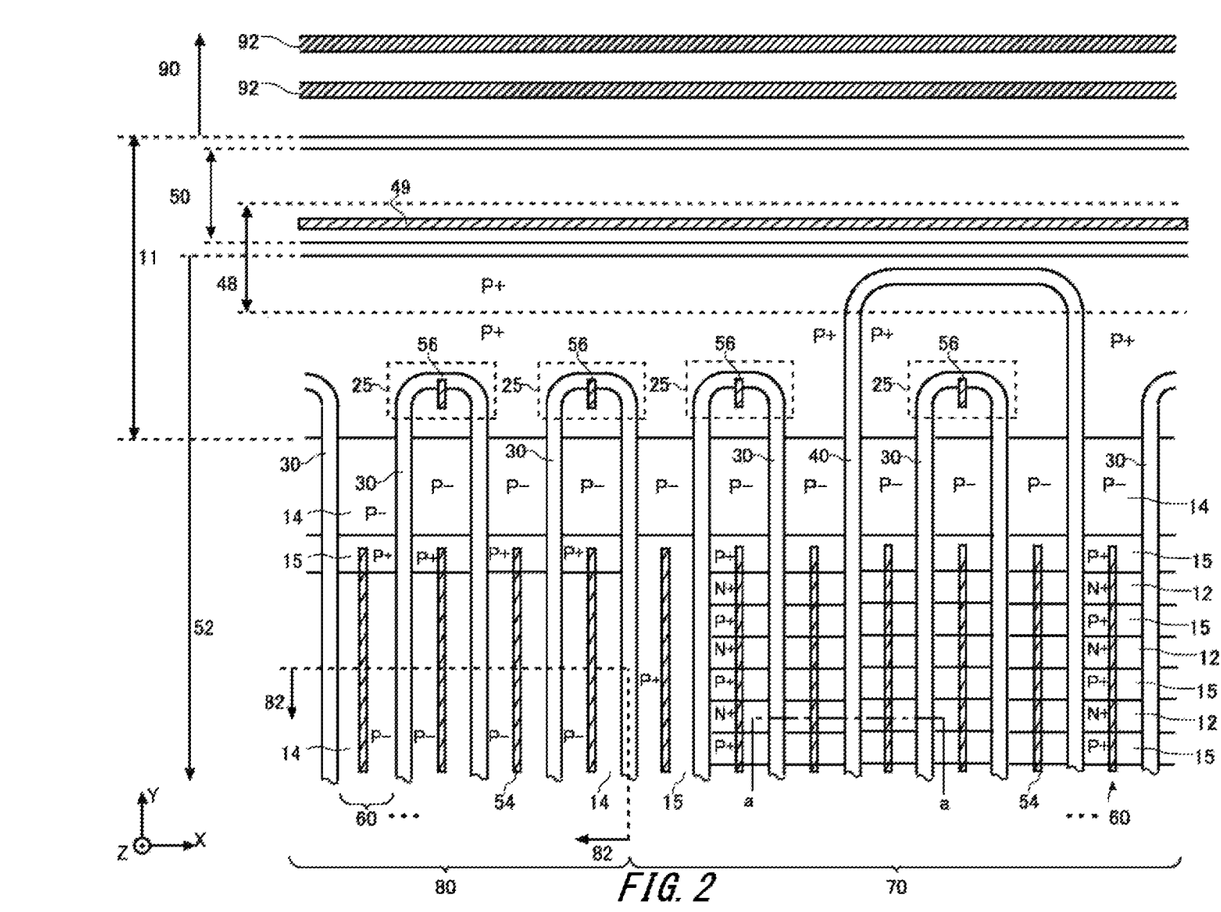
FIG. 2 shows an enlarged view of the vicinity of a region 130 in FIG. 1.

FIG. 2 is an enlarged view of a vicinity of the region 130 in FIG. 1. The semiconductor device 100 of the present example includes a guard ring 92, a gate trench portion 40, a dummy trench portion 30, a P+ type well region 11, an N+ type emitter region 12, a P− type base region 14 and a P+ type contact region 15 that are provided inside the semiconductor substrate 10 and are exposed on the upper surface of the semiconductor substrate 10. In the present specification, the gate trench portion 40 or the dummy trench portion 30 may be simply referred to as a trench portion. Also, the semiconductor device 100 of the present example includes an emitter electrode 52 and a gate metal layer 50 provided above the upper surface of the semiconductor substrate 10. The emitter electrode 52 and the gate metal layer 50 are provided being separated from each other.

The edge termination structure portion 90 is arranged outside the gate metal layer 50 (the positive side of the Y-axis direction). The edge termination structure portion 90 may have one or more guard rings 92 as described above. The guard ring 92 is a P type region provided inside the semiconductor substrate 10. The guard ring 92 is provided annularly surrounding the active region 102 outside the gate metal layer 50.

Although an interlayer dielectric film is provided between the emitter electrode 52 and the gate metal layer 50, and the upper surface of the semiconductor substrate 10, the interlayer dielectric film is omitted in FIG. 2. The interlayer dielectric film of the present example is provided with a contact hole 56, a contact hole 49 and a contact hole 54 that penetrate the interlayer dielectric film.

The emitter electrode 52 passes through the contact hole 54 to be in contact with an emitter region 12, a contact region 15 and a base region 14 that are on the upper surface of the semiconductor substrate 10. Also, the emitter electrode 52 passes through the contact hole 56 to be connected to a dummy conductive portion being inside the dummy trench portion 30. A connecting portion 25 formed of a conductive material such as polysilicon doped with impurities may be provided between the emitter electrode 52 and the dummy conductive portion. An insulating film such as an oxide film is formed between the connecting portion 25 and the upper surface of the semiconductor substrate 10.

The gate metal layer 50 passes through the contact hole 49 to be in contact with the gate runner 48. Note that in FIG. 1, the gate runner 48 in the region 130 is omitted. In the edge portion of the active region 102, the gate metal layer 50 and the gate trench portion 40 may also be connected to each other not through the gate runner 48.

The gate runner 48 is formed of polysilicon and the like doped with impurities. The gate runner 48 is connected to a gate conductive portion inside the gate trench portion 40 in the upper surface of the semiconductor substrate 10. The gate runner 48 is not connected to the dummy conductive portion inside the dummy trench portion 30. The gate runner 48 of the present example is provided below the contact hole 49 to an end portion of the gate trench portion 40.

An insulating film such as an oxide film is provided between the gate runner 48 and the upper surface of the semiconductor substrate 10. At the end portion of the gate trench portion 40, the gate conductive portion is exposed on the upper surface of the semiconductor substrate 10. A contact hole connected to the gate conductive portion and the gate runner 48 is provided to the insulating film above the gate conductive portion.

The emitter electrode 52 is formed of a material including metal. Note that although barrier metal including the titanium layer and the titanium nitride layer is provided between the emitter electrode 52 and the semiconductor substrate 10, the barrier metal is omitted in FIG. 2. The barrier metal may be provided to the transistor portion 70, and may also be provided to the transistor portion 70 and the diode portion 80. The barrier metal of the present example is provided to the entire region in which the emitter electrode 52 is arranged.

One or more gate trench portions 40 and one or more dummy trench portions 30 are arrayed at a predetermined interval along a predetermined array direction (in the present example, the X-axis direction) on the upper surface of the semiconductor substrate 10. At the transistor portion 70 of the present example, one or more gate trench portions 40 and one or more dummy trench portions 30 are alternately provided along the array direction. The dummy trench portion 30 is provided between the gate trench portions 40. In the diode portion 80, a plurality of dummy trench portions 30 are arranged along the X-axis direction on the upper surface of the semiconductor substrate 10.

The emitter electrode 52 is provided above the gate trench portion 40, the dummy trench portion 30, the well region 11, the emitter region 12, the base region 14 and the contact region 15. A diffusion depth of the well region 11 may be greater than the depth of the gate trench portion 40 and of the dummy trench portion 30.

One or more mesa portions 60 being sandwiched by the respective trench portions are provided to each of the transistor portion 70 and the diode portion 80. The mesa portion 60 refers to a region that is in a region of the semiconductor substrate 10 sandwiched by the trench portions and that is closer to the upper surface than the deepest bottom portion of the trench portion.

The base region 14 is provided to the mesa portion 60 sandwiched by the respective trench portions. The base region 14 is of a second conductivity type (P-type) having a lower doping concentration than that of a well region 11.

The contact region 15 of a second conductivity type having a higher doping concentration than that of the base region 14 is provided to an upper surface of the base region 14 of the mesa portion 60. At the upper surface of the semiconductor substrate 10, the base region 14 is exposed between the well region 11 and the contact region 15.

In the transistor portion 70, the emitter region 12 of a first conductivity type having a higher doping concentration than that of a drift region provided inside the semiconductor substrate 10 is selectively provided on an upper surface of the mesa portion 60.

In the mesa portion 60 of the transistor portion 70 of the present example, the contact region 15 and the emitter region 12 are alternately arranged along the Y-axis direction. Each of the contact region 15 and the emitter region 12 is provided from one of adjacent trench portions to the other of the trench portions. In another example, the contact region 15 and the emitter region 12 may also be respectively provided in a stripe shape along the Y-axis direction. In this case, the emitter region 12 may be arranged in both end portions in the X-axis direction of the mesa portion 60 in contact with the trench portion, and the contact region 15 may also be arranged in the X-axis direction of the center of the mesa portion 60 sandwiched by two emitter regions 12.

Among the mesa portions 60 of the transistor portion 70, one or more mesa portions 60 provided on a boundary between the transistor portion 70 and the diode portion 80 are provided with the contact region 15 having a larger area than the contact region 15 of the other mesa portions 60.

The base region 14 is arranged on the upper surface of the mesa portion 60 of the diode portion 80. However, the contact region 15 may also be selectively provided to the mesa portion 60.

In each mesa portion 60 of the present example, the contact hole 54 is provided above each region of the contact region 15, the emitter region 12 and the base region 14. The contact hole 54 of the present example is not provided in a region corresponding to the well region 11.

In the diode portion 80, an N+ type cathode region 82 is provided to a region being in contact with the lower surface of the semiconductor substrate 10. In FIG. 2, the region in which the cathode region 82 is provided is shown by broken lines. In the region being in contact with the lower surface of the semiconductor substrate 10, a P+ type collector region may be provided in a region in which the cathode region 82 is not provided.

Figure 3:
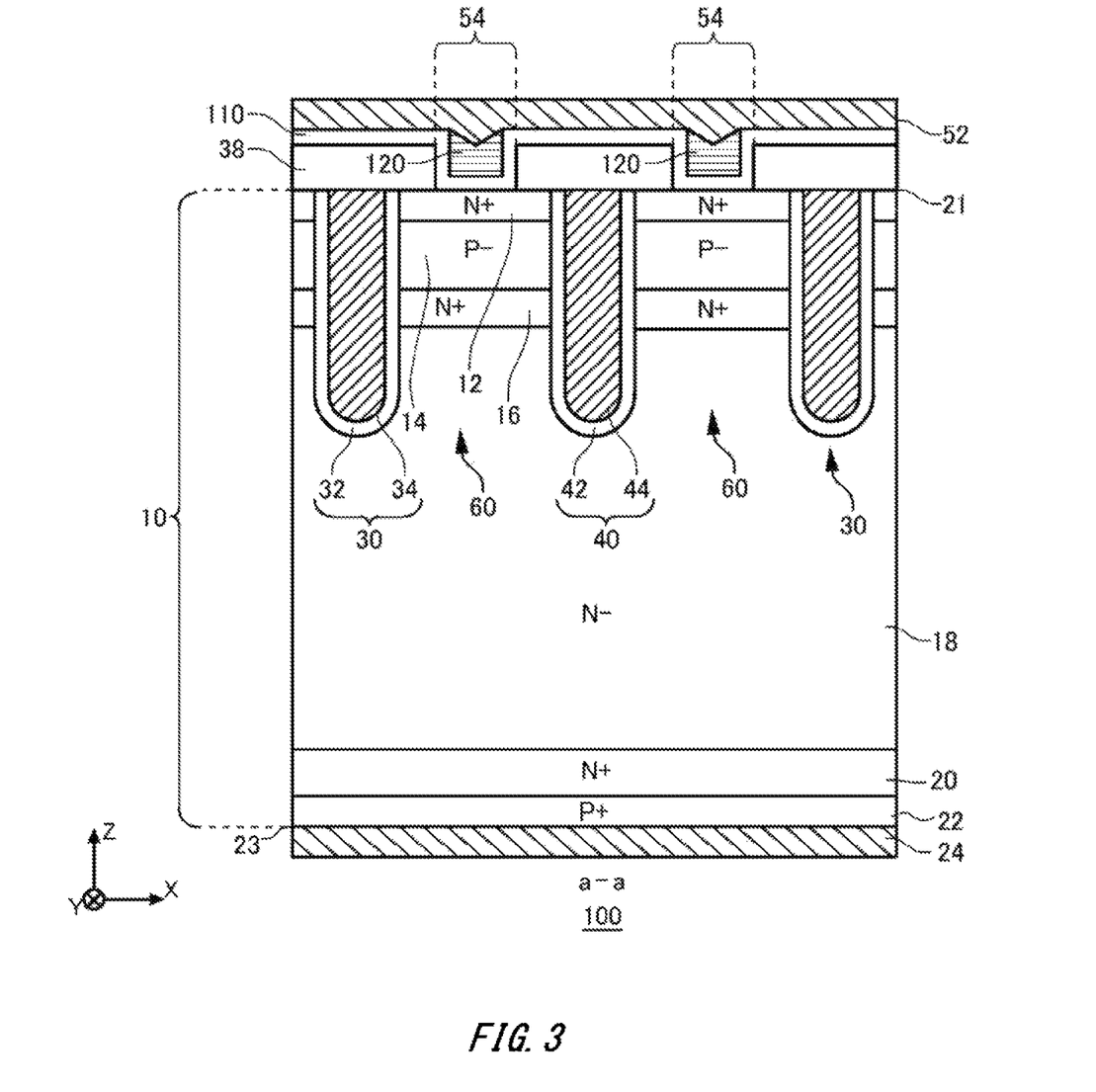
FIG. 3 shows one example of a cross section taken along a-a in FIG. 2.

FIG. 3 shows one example of the cross section taken along a-a in FIG. 2. The cross section taken along a-a is an X-Z cross section passing through the emitter region 12 in the transistor portion 70.

The semiconductor device 100 of the present example includes, in the cross section, the semiconductor substrate 10, the interlayer dielectric film 38, the barrier metal 110, the emitter electrode 52 and the collector electrode 24. The interlayer dielectric film 38 is provided covering at least a part of an upper surface 21 of the semiconductor substrate 10. The interlayer dielectric film 38 may be provided to the entire upper surface 21. The interlayer dielectric film 38 may be silicate glass such as PSG and BPSG, and may also be an oxide film, a nitride film or the like.

The interlayer dielectric film 38 is provided with an opening such as the contact hole 54. The contact hole 54 exposes the upper surface 21 of the semiconductor substrate 10. The contact hole 54 may be arranged on the center in the X-axis direction of the mesa portion 60. The contact hole 54 is arranged apart away from the trench portion in the X-axis direction.

The barrier metal 110 is provided on the interlayer dielectric film 38. The barrier metal 110 is also provided inside the contact hole 54 and is in contact with the upper surface 21, that the contact hole 54 exposes, of the semiconductor substrate 10. The barrier metal 110 is continuously provided extending over two or more contact holes 54. The barrier metal 110 of the present example is arranged in the entire region in which the emitter electrode 52 is provided.

The emitter electrode 52 is provided on the barrier metal 110. The emitter electrode 52 may be also provided inside the contact hole 54. In the present example, a tungsten plug 120 is provided on the barrier metal 110 inside the contact hole 54. The tungsten plug 120 of the present example is not provided in a region other than the contact hole 54. The emitter electrode 52 is also provided on the tungsten plug 120. By providing the tungsten plug 120, an electrical connection between the emitter electrode 52 and the semiconductor substrate 10 can be readily made even if the width of the contact hole 54 is fine.

A protective film such as a polyimide film is formed above the outer peripheral edge of the emitter electrode 52, of the gate pad 104 and of the emitter pad 106, and above the edge termination structure portion 90. Also, the semiconductor device 100 may be used in a state in which the semiconductor device 100 is arranged inside a package and covered with sealing gel or a state in which the semiconductor device 100 is molded by resin. In this case, the emitter electrode 52 is in contact with sealing gel such as silicon gel or molding resin such as epoxy resin. If damage or the like is generated in the emitter electrode 52, resin ions from the sealing gel or the molding resin may pass through the emitter electrode 52 and reach the gate insulating film. When the resin ions are trapped by the gate insulating film, the threshold voltage of the semiconductor device 100 changes. By providing the barrier metal to the entire surface of the emitter electrode 52, the resin ions can be suppressed from reaching the gate insulating film.

However, when the barrier metal is provided on the entire surface, hydrogen ions are suppressed from passing therethrough. Although damage such as crystal defect caused by implantation and the like of donor ions or acceptor ions is present inside the semiconductor substrate 10, the damage can be recovered by implanting the hydrogen ions to perform annealing. For this reason, when the barrier metal is provided to the entire surface, it is difficult to recover the damage inside the semiconductor substrate 10.

In the semiconductor device 100 of the present example, the barrier metal 110 has a structure described later in FIG. 4 and the like, and accordingly, the damage in the semiconductor substrate 10 is recovered by causing the hydrogen ions passing therethrough.

A collector electrode 24 is provided on a lower surface 23 of the semiconductor substrate 10. The collector electrode 24 may be in contact with the entire lower surface 23 of the semiconductor substrate 10. The emitter electrode 52 and the collector electrode 24 are formed of a conductive material such as metal. For example, at least a partial region of the emitter electrode 52 and the collector electrode 24 is formed of aluminum or alloy containing or aluminum as a main component. The alloy containing aluminum as the main component, includes aluminum-silicon alloy, aluminum-copper alloy, aluminum-silicon-copper alloy and the like. In the present specification, a direction connecting the emitter electrode 52 and the collector electrode 24 is referred to as a depth direction (the Z axis direction).

A P− type base region 14 is provided on the upper surface of the semiconductor substrate 10. Inside the semiconductor substrate 10, an N− type drift region 18 is arranged below the base region 14.

In each mesa portion 60 of the transistor portion 70 of the present example, an N+ type emitter region 12, a P− type base region 14 and an N+ type accumulation region 16 are arranged in order from the upper surface side of the semiconductor substrate 10. The accumulation region 16 has a higher doping concentration than that of the drift region 18. The drift region 18 is provided below the accumulation region 16. By providing, between the drift region 18 and the base region 14, the accumulation region 16 having a higher concentration than that of the drift region 18, the carrier Injection-Enhancement effect (IE effect) is increased and an ON voltage in the transistor portion 70 can be reduced. The accumulation region 16 may also be provided or may also not be provided in the mesa portion 60 of the diode portion 80.

Note that in the X-Z cross section passing through the contact region 15 of the transistor portion 70, each mesa portion 60 of the transistor portion 70 is provided with the contact region 15, instead of the emitter region 12. The contact region 15 may function as a latch-up suppression layer to suppress latch-up.

In the transistor portion 70, a region adjacent to the lower surface 23 of the semiconductor substrate 10 is provided with a P+ type collector region 22. In the diode portion 80, a region adjacent to the lower surface 23 of the semiconductor substrate 10 is provided with an N+ type cathode region 82.

In the semiconductor substrate 10 of the present example, an N+ type buffer region 20 is provided between the drift region 18 and the collector region 22, and between the drift region 18 and the cathode region 82. The doping concentration of the buffer region 20 is higher than the doping concentration of the drift region 18. The buffer region 20 may function as a field stop layer to prevent a depletion layer that expands from the lower surface side of the base region 14 from reaching the P+ type collector region 22 and the N+ type cathode region 82.

One or more gate trench portions 40 and one or more dummy trench portions 30 are provided in the semiconductor substrate 10 on the upper surface 21 side. Each trench portion penetrates the base region 14 from the upper surface 21 of the semiconductor substrate 10 and reaches the drift region 18. In the region in which at least any one of the emitter region 12, the contact region 15 and the accumulation region 16 is provided, each trench portion also penetrates these regions and reaches the drift region 18. That the trench portion penetrates the doping region does not necessarily mean that fabrication is performed is the order of forming the doping region and subsequently forming the trench portion. That the doping region is formed between the trench portions after the trench portions are formed includes that the trench portions penetrate the doping region.

The gate trench portion 40 has a gate trench, a gate insulating film 42 and a gate conductive portion 44 provided in the semiconductor substrate 10 on the upper surface side. The gate insulating film 42 is provided covering an inner wall of the gate trench. The gate insulating film 42 may be formed by oxidizing or nitriding the semiconductor of the inner wall of the gate trench. The gate conductive portion 44 is provided on an inner side relative to the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes a region facing at least adjacent base region 14 with the gate insulating film 42 being interposed therebetween in the depth direction. The gate trench portion 40 in the cross section is covered by the interlayer dielectric film 38 on the upper surface of the semiconductor substrate 10. When a predetermined voltage is applied to the gate conductive portion 44, a channel as an inversion layer of electrons is formed on a front layer of a surface layer of an interface being in contact with the gate trench of the base region 14.

The dummy trench portion 30 may have the same structure as that of the gate trench portion 40 in the cross section. The dummy trench portion 30 has a dummy trench, a dummy insulating film 32 and a dummy conductive portion 34 that are provided in the semiconductor substrate 10 on the upper surface 21 side. The dummy insulating film 32 is provided covering an inner wall of the dummy trench. The dummy insulating film 32 may be formed by oxidizing or nitriding the semiconductor of the inner wall of the dummy trench. The dummy conductive portion 34 is provided inside the dummy trench and is provided on an inner side relative to the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have the same length as that of the gate conductive portion 44 in the depth direction. The dummy trench portion 30 in the cross section is covered by the interlayer dielectric film 38 in the upper surface 21 of the semiconductor substrate 10.

Figure 4:
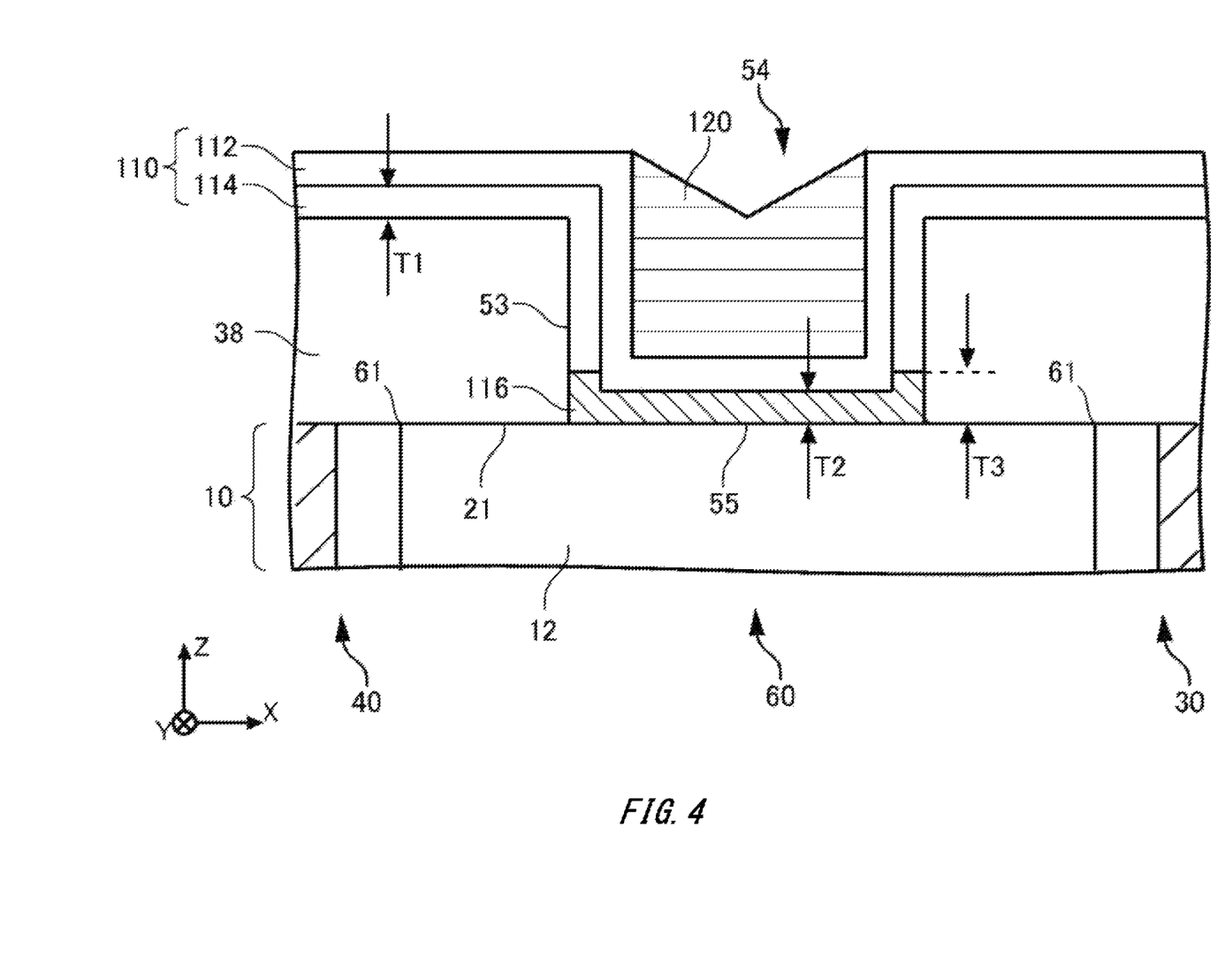
FIG. 4 shows a cross sectional view of one example of a structure of a barrier metal 110.

FIG. 4 shows a cross sectional view of one example of a structure of the barrier metal 110. The barrier metal 110 has a titanium layer 114 and a titanium nitride layer 112. The titanium layer 114 is provided on the interlayer dielectric film 38. The titanium nitride layer 112 is provided on the titanium layer 114. Also, the titanium layer 114 and the titanium nitride layer 112 are also provided inside the contact hole 54. Inside the contact hole 54, the tungsten plug 120 is provided on the titanium nitride layer 112.

The contact hole 54 of the present example has a bottom portion 55 on which the upper surface 21 of the semiconductor substrate 10 is exposed, and a side wall 53 extending upwardly from the upper surface 21 of the semiconductor substrate 10. The titanium layer 114 is provided along the bottom portion 55 and the side wall 53 of the contact hole 54. However, the titanium layer 114 arranged being in contact with the semiconductor substrate 10 in the bottom portion 55 is entirely titanium-silicided. In FIG. 4, the titanium-silicided titanium layer 114 is defined as a titanium silicide layer 116. The titanium silicide indicates compounds of titanium and silicon, including TiSi, $TiSi_2$ or the like, and they may also be present alone or may also be present in a mixed state.

That the titanium layer 114 is entirely titanium-silicided means that the titanium layer 114 is titanium-silicided over an entire region from a portion being in contact with the upper surface 21 of the semiconductor substrate 10 to a portion being in contact with the titanium nitride layer 112 in the Z axis direction. That is, titanium that is not titanium-silicided is not present in the region. However, in the titanium layer 114 extending upwardly along the side wall 53, a portion being in contact with the upper surface 21 of the semiconductor substrate 10 is titanium-silicided by a predetermined thickness T3. Among the titanium layer 114 arranged along the side wall 53, a portion upper than the thickness T3 may be remained not being titanium-silicided. Note that the titanium nitride layer 112 of the present example is remained not being entirely titanium-silicided.

The titanium silicide layer 116 can be formed by annealing the semiconductor substrate 10 after providing the titanium layer 114. The annealing is performed on the titanium layer 114 of a predetermined thickness under a condition that the titanium siliciding can be performed over the entire region thereof in the thickness direction. As one example, the thickness T1 of the titanium layer 114 in the Z axis direction is 45 nm or smaller, and an annealing temperature is 700° C. or higher. The annealing temperature may be 750° C. or higher, and may also be 800° C. or higher. The annealing time may be 5 minutes or longer, may be 10 minutes or longer and may also be 15 minutes or longer.

Note that the thickness of the titanium nitride layer 112 may be twice as large as the thickness of the titanium layer 114 or larger. As one example, the thickness of the titanium nitride layer 112 is 100 nm. Also, the thickness of the emitter electrode 52 is 5 μm, as one example. The thickness of the tungsten plug 120 is larger than the thickness of the titanium nitride layer 112 and is smaller than the thickness of the emitter electrode 52. As one example, the thickness of the tungsten plug 120 is 700 nm.

The titanium nitride layer 112 is difficult to be titanium-silicided compared to the titanium layer 114. For this reason, the annealing may be performed on the semiconductor substrate 10 under a predetermined condition after the titanium layer 114 and the titanium nitride layer 112 are provided. Accordingly, while the entire titanium layer 114 of the bottom portion 55 is titanium-silicided, the entire titanium nitride layer 112 can be remained. In another example, the titanium nitride layer 112 may also be formed after the titanium layer 114 of the bottom portion 55 is titanium-silicided. Accordingly, the entire titanium nitride layer 112 can be readily remained. By making the entire titanium nitride layer 112 remained, aluminum in the emitter electrode 52 and the like is easily suppressed from entering into the semiconductor substrate 10.

By titanium siliciding the entire titanium layer 114 of the bottom portion 55, hydrogen easily passes therethrough via the titanium silicide layer 116. For this reason, the hydrogen easily enters inside the semiconductor substrate 10, and the damage including crystal defect and the like generated inside the semiconductor substrate 10 is easily recovered. Also, by providing the titanium silicide layer 116, contact resistance between the barrier metal 110 and the semiconductor substrate 10 can be reduced.

For example, in a process of forming the tungsten plug 120, lots of hydrogen may be used for removing fluorine and the like. In such a process, hydrogen ions are implanted into the semiconductor substrate 10 via the titanium silicide layer 116, and the damaged inside the substrate is recovered.

Note that the titanium layer 114 provided on the interlayer dielectric film 38 may not include the titanium-silicided portion. For example, the titanium layer 114 arranged above the both end portions 61 in the X-axis direction of the mesa portion 60 does not include the titanium-silicided portion. Accordingly, aluminum in the emitter electrode 52 and the like can be easily suppressed from entering into the interlayer dielectric film 38.

In a region other than the contact hole 54, the thickness T1 of the titanium layer 114 provided on the interlayer dielectric film 38 may be 30 nm or larger and 45 nm or smaller. Note that the thickness of the titanium layer 114 inside the contact hole 54 before being titanium-silicided is also T1. The thickness T2 of the titanium silicide layer 116 may be the same as and may also be different from the thickness T1.

If the thickness T1 of the titanium layer 114 is too large, the entire contact portion of the titanium layer 114 with the semiconductor substrate 10 is difficult to be titanium-silicided. The thickness T1 of the titanium layer 114 may also be 40 nm or smaller. Accordingly, the entire contact portion of the titanium layer 114 with the semiconductor substrate 10 can be relatively readily titanium-silicided. If the thickness T1 of the titanium layer 114 is too small, it is difficult to maintain the uniformity of the film thickness. Also, if the thickness T1 is too small, when wire or the like is to be bonded above the emitter electrode 52, the emitter electrode 52 may penetrate the barrier metal 110. The thickness T1 may also be 35 nm or larger.

As described above, the titanium layer 114 arranged along the side wall 53 of the contact hole 54 is titanium-silicided from the upper surface 21 of the semiconductor substrate 10 to a predetermined thickness T3. The thickness T3 may be the same as the thickness T2 and may also be larger than the thickness T2. By making the thickness T3 of the titanium silicide layer 116 in the titanium layer 114 along the side wall 53 large, hydrogen ions easily pass through the edge portion of the bottom portion 55 of the contact hole 54. For this reason, hydrogen ions also easily enter into a region of the semiconductor substrate 10 adjacent to the bottom portion 55 (that is, a region near the trench portion). For this reason, by terminating the defect in the region near the trench portion, the damage in the substrate is easily recovered. As one example, the thickness T2 of the titanium silicide layer 116 is a thickness in the Z axis direction of the titanium silicide layer 116 on the center of the bottom portion 55 in the X-axis direction, and the thickness T3 is a thickness in the Z axis direction of the titanium silicide layer 116 being in contact with the side wall 53.

Figure 5:
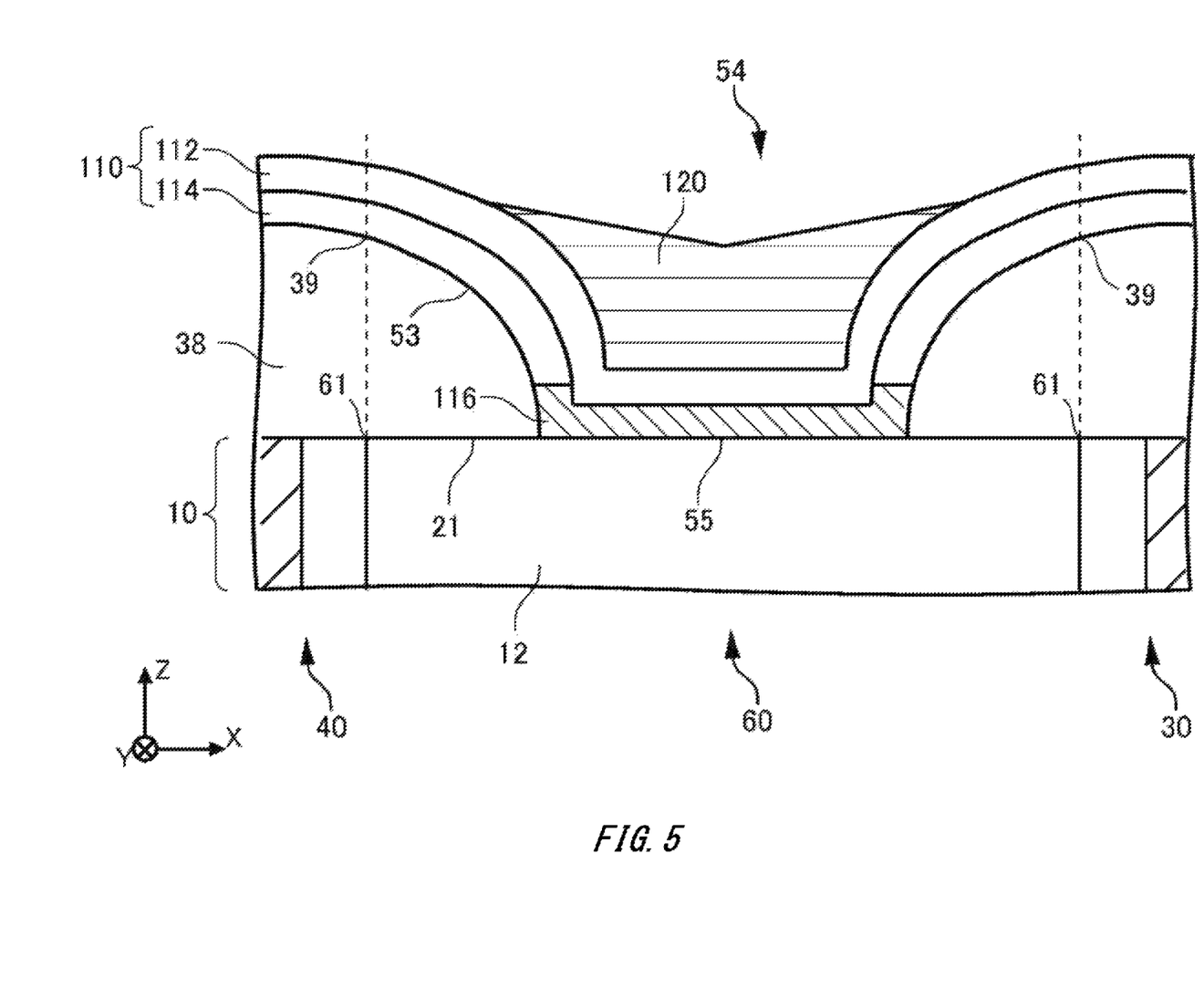
FIG. 5 shows another example of a shape of a contact hole 54.

FIG. 5 shows another example of a shape of the contact hole 54. In an example of FIG. 4, the side wall 53 of the interlayer dielectric film 38 on the contact hole 54 has a linear shape. In the example of FIG. 5, at least a part of the side wall 53 of the interlayer dielectric film 38 on the contact hole 54 has an upwardly convex curved shape. For this reason, the contact hole 54 has a tapered shape, that is, an opening area thereof increases as it is apart away from the upper surface 21 of the semiconductor substrate 10.

The shape of the side wall 53 can be controlled by a process such as reflowing after the contact hole 54 is formed. For example, the contact hole 54 in the example of FIG. 4 is formed by anisotropic etching such as dry etching. The contact hole 54 in the example of FIG. 5 can be formed by melting the interlayer dielectric film 38 at a predetermined temperature after the opening is formed by anisotropic etching.

In the present example as well, the bottom portion 55 of the contact hole 54 is provided with the titanium silicide layer 116 in which the titanium layer 114 is entirely titanium-silicided. By making the side wall 53 have a curved shape, hydrogen ions easily reach the bottom portion 55 of the contact hole 54. For this reason, the damage including the crystal defect and the like in the semiconductor substrate 10 is easily recovered.

As one example, the side wall 53 of the interlayer dielectric film 38 may have a curved shape above the both end portions 61 in the X-axis direction of the mesa portion 60. The side wall 53 may have a curved shape from a position that is in contact with the upper surface 21 of the semiconductor substrate 10 to a position that is on the outer side of a position 39 being above each of the both end portions 61 of the mesa portion 60.

Figure 6:
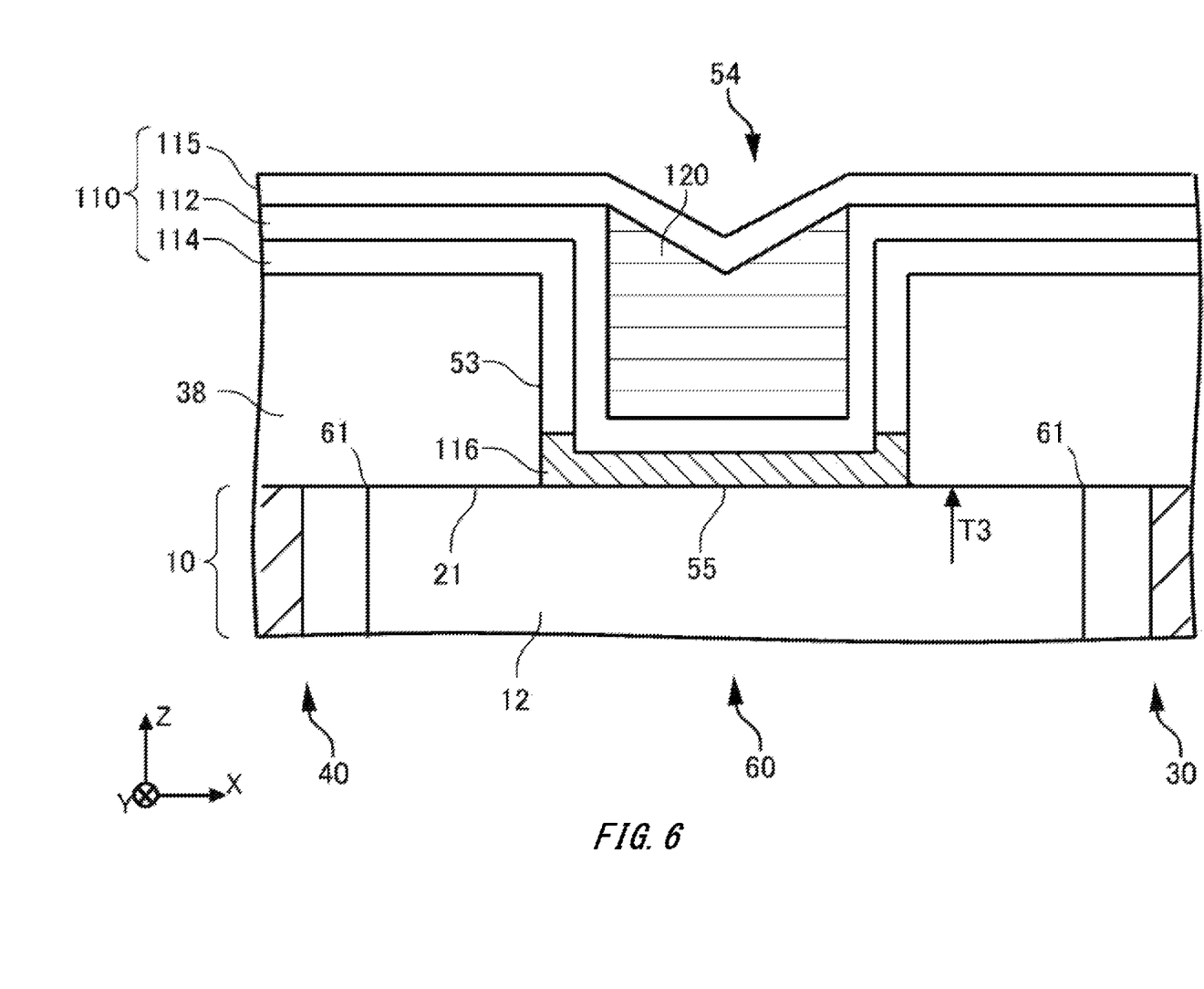
FIG. 6 shows another exemplary structure of the barrier metal 110.

FIG. 6 shows another exemplary structure of the barrier metal 110. The barrier metal 110 of the present example may also be applied to any one of the examples shown in FIG. 4 and FIG. 5. The barrier metal 110 of the present example further has a second titanium layer 115 in addition to the structure shown in FIG. 4 or FIG. 5.

The second titanium layer 115 is provided on the titanium nitride layer 112 and on the tungsten plug 120. The second titanium layer 115 does not have a titanium-silicided portion.

The second titanium layer 115 of the present example is formed after the tungsten plug 120 is formed. For this reason, before the second titanium layer 115 is provided, the damage in the semiconductor substrate 10 has already recovered. By providing the second titanium layer 115, the strength of the barrier metal 110 can be further improved, and furthermore, hydrogen can be suppressed from entering into the gate insulating film and the like in actual use and the like. For this reason, characteristic change with time can be suppressed.

Figure 7:
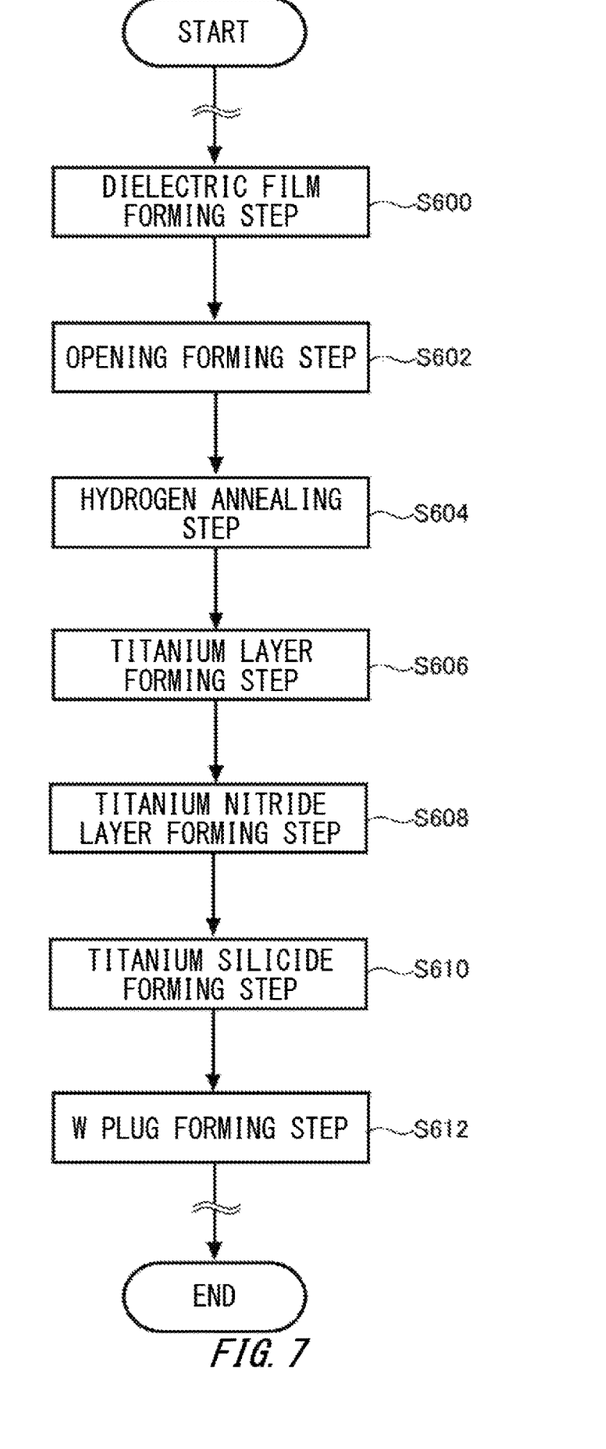
FIG. 7 shows a partial process of a manufacturing method of the semiconductor device 100.

FIG. 7 shows a partial process in a method of manufacturing the semiconductor device 100. The manufacturing method of the present example includes a dielectric film forming step S600. In the dielectric film forming step S600, an interlayer dielectric film 38 is formed on the upper surface 21 of the semiconductor substrate 10. Another film such as an oxide film may also be provided between the upper surface 21 and the interlayer dielectric film 38.

The manufacturing method of the present example has an opening forming step S602 after the dielectric film forming step S600. The opening forming step S602 may include a process of forming a predetermined mask pattern on the interlayer dielectric film 38, a process of etching the interlayer dielectric film 38 by using the mask pattern, and a process of removing the mask pattern. Accordingly, an opening such as the contact hole 54 is formed.

The manufacturing method of the present example includes a hydrogen annealing step S604 after the opening forming step S602. The hydrogen annealing step S604 may also be performed before the dielectric film forming step S600 as long as an ion implantation process is not performed after the dielectric film forming step S600. In the hydrogen annealing step S604, the annealing is performed on the semiconductor substrate 10 in hydrogen-containing atmosphere. The hydrogen annealing step S604 may be performed after doping regions such as the emitter region 12, the contact region 15, the base region 14 and the well region 11 are formed. Accordingly, at least some of the damage in the semiconductor substrate 10 generated when these doping regions are formed can be recovered.

The manufacturing method of the present example includes a titanium layer forming step S606 after the hydrogen annealing step S604. In the titanium layer forming step S606, a titanium layer 114 is formed on the interlayer dielectric film 38 and in the opening. The titanium layer 114 may form by a sputtering method and the like. The thickness T1 of the titanium layer 114 may be 30 nm or larger and 45 nm or smaller.

The manufacturing method of the present example includes a titanium nitride layer forming step S608 after the titanium layer forming step S606. In the titanium nitride layer forming step S608, the titanium nitride layer 112 is formed on the titanium layer 114. The titanium nitride layer 112 may be formed by a sputtering method and the like.

The manufacturing method of the present example includes a titanium siliciding step S610 after the titanium nitride layer forming step S608. In the titanium siliciding step S610, the titanium layer 114 arranged being in contact with the semiconductor substrate 10 on the bottom portion 55 of the opening is entirely titanium-silicided.

The manufacturing method of the present example includes a tungsten plug forming step S612 after the titanium siliciding step S610. In the tungsten plug forming step S612, the tungsten plug 120 is formed on the titanium nitride layer 112 being within the opening. The tungsten plug layer 120 may be formed by a CVD method and the like in the hydrogen-containing atmosphere. In the tungsten plug forming step S612, hydrogen ions is implanted into the semiconductor substrate 10 by passing through the titanium silicide layer 116, and the damage in the semiconductor substrate 10 is recovered.

Note that the hydrogen ions may also be implanted into the semiconductor substrate 10 during a process other than the tungsten plug forming step S612. The manufacturing method may include, after the titanium siliciding step S610, a process of implanting the hydrogen ions into the semiconductor substrate 10 and performing annealing.

According to such a process, the damage inside the semiconductor substrate 10 can be recovered. For example, the damage remained in the hydrogen annealing step S604 and the damage generated after the hydrogen annealing step S604 can be recovered. For example, the sputtering and the like may also cause the damage inside the semiconductor substrate 10.

In the titanium siliciding step S610, the annealing temperature for the semiconductor substrate 10 may be higher than a temperature at which the tungsten film is formed in the tungsten plug forming step S612. The annealing temperature in the titanium siliciding step S610 is, for example, 700° C. or higher. The film forming temperature in the tungsten plug forming step S612 is, for example, 500° C. or lower. By increasing the annealing temperature in the titanium siliciding step S610, the entire titanium layer 114 is readily titanium-silicided. The annealing time in the titanium siliciding step S610 may be longer than the film forming time in the tungsten plug forming step S612. The annealing time in the titanium siliciding step S610 is, for example, 5 minutes or longer. The annealing time may be 10 minutes or longer and may also be 15 minutes or longer. The film forming time in the tungsten plug forming step S612 is, for example, 3 minutes or shorter.

The annealing temperature for the semiconductor substrate 10 in the titanium siliciding step S610 may also be higher than the annealing temperature in the hydrogen annealing step S604. The annealing temperature in the hydrogen annealing step S604 is, for example, 500° C. or lower. The annealing time in the titanium siliciding step S610 may be shorter than and may also be longer than the annealing time in the hydrogen annealing step S604. The annealing time in the hydrogen annealing step S604 is, for example, 10 minutes or shorter.

The manufacturing method may also include a collector plug forming step of forming, on the upper surface of the semiconductor substrate 10 exposed by the contact hole 54, a P type collector plug region having a higher doping concentration than that of the contact region 15. The collector plug region may be provided only to the transistor portion 70 and may also be provided to the transistor portion 70 and the diode portion 80.

The collector plug region is formed by implanting impurities ions in an area that is shallower than the contact region 15. By forming the collector plug region, contact resistance between the barrier metal 110 and the semiconductor substrate 10 can be reduced. The collector plug forming step may be performed between the opening forming step S602 and the titanium layer forming step S606. As described above, the damage generated in the collector plug region forming step can also be recovered in the tungsten plug forming step S612 and the like.

As described in FIG. 5, the manufacturing method may further include a reflowing step of making the side wall 53 of the interlayer dielectric film 38 in a curved shape. The reflowing step is performed after the opening forming step S602. The reflowing step may be performed between the opening forming step S602 and the collector plug forming step.

As described in FIG. 6, the manufacturing method may further include a second titanium layer forming step of forming the second titanium layer 115. The second titanium layer forming step is performed after the tungsten plug forming step S612. In the second titanium layer forming step, the second titanium layer 115 may be formed by sputtering and the like.

Figure 8:
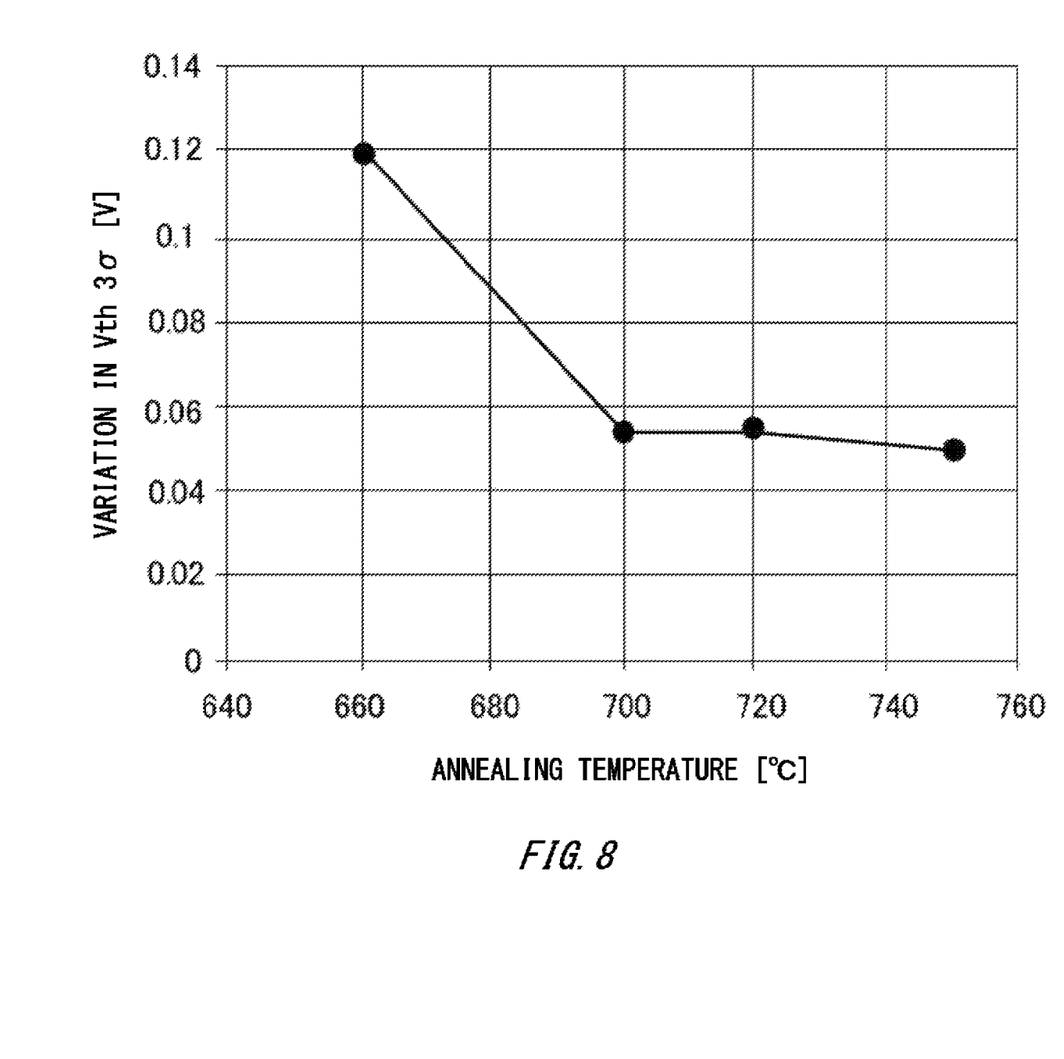
FIG. 8 shows a relation between an annealing temperature in a titanium siliciding step S610 and a variation (3σ) in a threshold voltage Vth of the semiconductor device 100.

FIG. 8 shows a relation between the annealing temperature in the titanium siliciding step S610 and a variation (3σ) in a threshold voltage Vth of the semiconductor device 100. The thickness of the titanium layer 114 in the present example is 40 nm. Also, the annealing time is 10 minutes. The threshold voltage Vth changes due to the damage such as the crystal defect within the semiconductor substrate 10. When the damage in the semiconductor substrate 10 is not sufficiently recovered, a variation in recovery degree of the damage is generated and the variation in the threshold voltage Vth is large. In this way, the remained damage such as the crystal defect affects the characteristics of the semiconductor device 100.

As shown in FIG. 8, when the annealing temperature is 700° C., the variation in the threshold voltage Vth is suppressed. Also, even if the annealing temperature is higher than 700° C., the variation in the threshold voltage Vth does not change significantly. It is considered that this is because the titanium layer 114 being in contact with the upper surface 21 of the semiconductor substrate 10 is entirely titanium-silicided by making the annealing temperature be 700° C.

Note that when any one of the titanium siliciding step S610 and the tungsten plug forming step S612 (that is, the step of implanting hydrogen after the titanium siliciding step S610) is not performed, the variation in the threshold voltage Vth was not small. It is considered that for this reason, by causing the hydrogen ions to pass through the titanium silicide layer 116, the damage in the semiconductor substrate 10 is recovered.

Figure 9:
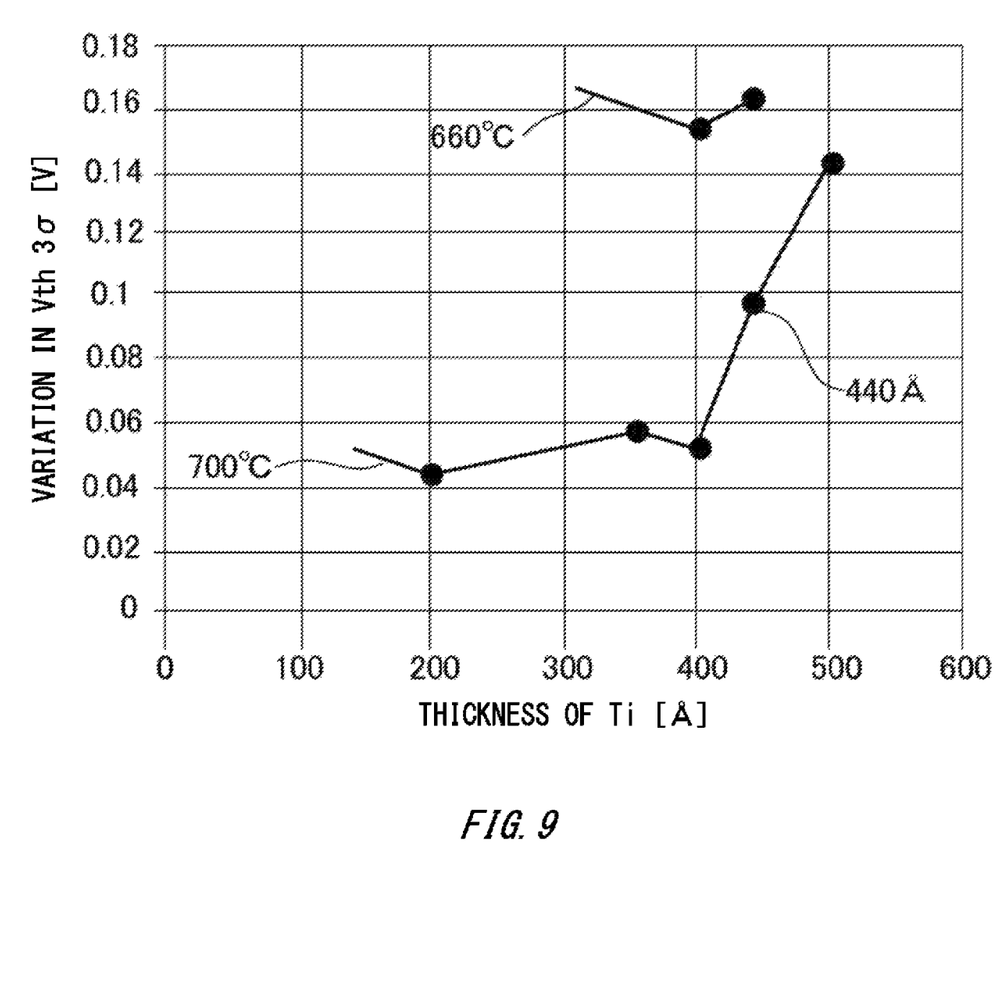
FIG. 9 shows a relation between the thickness T1 of a titanium layer 114 and the variation in the threshold voltage Vth.

FIG. 9 shows a relation between the thickness T1 of the titanium layer 114 and the variation in the threshold voltage Vth. The annealing time in the present example is 10 minutes. Also, in FIG. 9, a case where the annealing temperature is 660° C. and a case where the annealing temperature is 700° C. are shown.

In the case where the annealing temperature is 700° C., if the thickness T1 of the titanium layer 114 is 45 nm or smaller, the variation in threshold voltage Vth was relatively small. Also, if the thickness T1 of the titanium layer 114 is 40 nm or smaller, the variation in the threshold voltage Vth was approximately constant. It is considered that in a region in which the thickness T1 is 40 nm or smaller, the titanium layer 114 being in contact with the upper surface 21 of the semiconductor substrate 10 is entirely titanium-silicided. As one example, the thickness T1 of the titanium layer 114 may be 40 nm or smaller and the annealing temperature may be 700° C. or higher.

Note that in the case where the annealing temperature is 660° C., even if the thickness T1 of the titanium layer 114 is set to 40 nm, the variation in the threshold voltage Vth was not small. It is considered that under the condition, the titanium layer 114 being in contact with the semiconductor substrate 10 is not entirely titanium-silicided and the titanium is remained therein. However, as shown in FIG. 5, when the side wall 53 of the interlayer dielectric film 38 is in the curved shape, even if the annealing temperature is 660° C., the variation in the threshold voltage Vth was small.

Note that when the annealing temperature is 650° C., 700° C. and 750° C., a tensile strength test of the emitter electrode 52 was performed. In the tensile strength test, whether the emitter electrode 52 is peeled off or not was tested by joining a pin to the emitter electrode 52 to pull the emitter electrode 52. Even if the annealing temperature is increased to 700° C. or 750° C., reduction of the tensile strength was not found.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a semiconductor substrate;
    an interlayer dielectric film arranged on an upper surface of the semiconductor substrate;
    a titanium layer provided on the interlayer dielectric film; and
    a titanium nitride layer provided on the titanium layer, wherein
    the interlayer dielectric film is provided with an opening that exposes a part of the upper surface of the semiconductor substrate,
    the titanium layer and the titanium nitride layer are provided also within the opening,
    the titanium layer arranged in contact with the semiconductor substrate and on a bottom portion of the opening is entirely titanium-silicided,
    a bottom surface of the titanium nitride layer in the opening being in contact with the titanium-silicided bottom portion of the titanium layer, and a lower portion of a side wall surface of the titanium nitride layer in the opening being in contact with a titanium-silicided side wall portion of the titanium layer,
    a height of the titanium layer provided on the interlayer dielectric film and in a region other than the opening is 30 nm or larger and 45 nm or smaller, and
    T3>T2, wherein
        T2 is a height from the upper surface of the substrate of the titanium-silicided portion of the titanium layer in the bottom portion of the opening of the interlayer dielectric film, and
        T3 is a distance that the titanium-silicided side wall portion of the titanium layer extends upwardly in the opening along a side wall of the interlayer dielectric film.

2. The semiconductor device according to claim 1, further comprising a tungsten plug provided in the opening and on the titanium nitride layer.

3. The semiconductor device according to claim 2, further comprising
    a second titanium layer that is provided on the titanium nitride layer and on the tungsten plug, and that is not titanium-silicided.

4. The semiconductor device according to claim 1, wherein
    the titanium layer provided on the interlayer dielectric film and in a region other than the opening is a titanium layer that does not include a titanium-silicided portion.

5. The semiconductor device according to claim 1, wherein
    at least a part of a side wall of the interlayer dielectric film in the opening has an upwardly convex curved shape.
6. The semiconductor device according to claim 5, wherein
    the semiconductor substrate has:
        a plurality of trench portions that are provided from the upper surface of the semiconductor substrate to inside the semiconductor substrate and are arranged in a predetermined array direction on the upper surface of the semiconductor substrate; and
        a mesa portion that is sandwiched by two trench portions in the array direction,
    the interlayer dielectric film is provided covering an upper end portion of at least some of the trench portions,
    the opening is provided so as to expose an upper surface of at least some of mesa portions including the mesa portion, and
    the side wall of the interlayer dielectric film has the curved shape above at least both end portions of the mesa portion in the array direction.

7. A semiconductor device comprising:
    a semiconductor substrate;
    an interlayer dielectric film arranged on an upper surface of the semiconductor substrate;
    a titanium layer provided on the interlayer dielectric film;
    a titanium nitride layer provided on the titanium layer;
    a plurality of the openings; and
    the titanium layer and the titanium nitride layer are continuously provided between adjacent ones of the plurality of openings, wherein
    the interlayer dielectric film is provided with an opening that exposes a part of the upper surface of the semiconductor substrate,
    the titanium layer and the titanium nitride layer are provided also within the opening,
    the titanium layer arranged in contact with the semiconductor substrate and on a bottom portion of the opening is entirely titanium-silicided, and
    a height of the titanium layer provided on the interlayer dielectric film and in a region other than the opening is 30 nm or larger and 45 nm or smaller.

\* \* \* \* \*